(12) United States Patent
Campos et al.

(10) Patent No.: US 11,018,546 B2
(45) Date of Patent: May 25, 2021

(54) ARC RESISTANT DEVICE AND METHOD

(71) Applicant: Toshiba International Corporation, Houston, TX (US)

(72) Inventors: Walter Campos, Houston, TX (US); Enrique Martinez, Houston, TX (US)

(73) Assignee: Toshiba International Corporation, Houston, TX (US)

( * ) Notice: Subject to any disclaimer, the term of this patent is extended or adjusted under 35 U.S.C. 154(b) by 0 days.

(21) Appl. No.: 16/588,091

(22) Filed: Sep. 30, 2019

(65) Prior Publication Data

US 2021/0099044 A1    Apr. 1, 2021

(51) Int. Cl.
| | |
|---|---|
| *H02H 3/04* | (2006.01) |
| *H02K 5/04* | (2006.01) |
| *H02H 7/08* | (2006.01) |
| *H05K 5/03* | (2006.01) |
| *H05K 5/02* | (2006.01) |

(52) U.S. Cl.
CPC ............. *H02K 5/04* (2013.01); *H02H 7/0833* (2013.01); *H05K 5/0213* (2013.01); *H05K 5/0217* (2013.01); *H05K 5/03* (2013.01)

(58) Field of Classification Search
CPC .......... H02P 1/30; H02M 7/003; H05K 7/206; H05K 5/0213; H05K 5/0217; H02K 5/04; H02K 5/03; H02H 7/0833
See application file for complete search history.

(56) References Cited

U.S. PATENT DOCUMENTS

| | | | | |
|---|---|---|---|---|
| 8,134,323 | B2 * | 3/2012 | Leung ..................... | F04D 13/12 318/503 |
| 2008/0239668 | A1 * | 10/2008 | Hendrix ............. | H05K 7/20563 361/695 |

* cited by examiner

*Primary Examiner* — Karen Masih
(74) *Attorney, Agent, or Firm* — Baker Botts L.L.P.

(57) ABSTRACT

The systems and methods disclosed relate to arc resistant medium voltage motor control centers. A drive control system comprises a variable frequency drive cabinet comprising a variable frequency drive; a power supply line; and at least one motor control cabinet having a top portion and a bottom portion, wherein the at least one motor control cabinet comprises: a medium voltage fused bypass controller in the bottom portion; a medium voltage non-fused transfer controller in the top portion; a first door disposed within the bottom portion; a second door disposed within the top portion; and an air vent, wherein the air vent is disposed in the first door, wherein the first door, the second door, and the air vent are arc resistant; wherein the variable frequency drive is coupled to the power supply line and the non-fused transfer controller and the fused bypass controller is coupled to the power supply line.

20 Claims, 9 Drawing Sheets

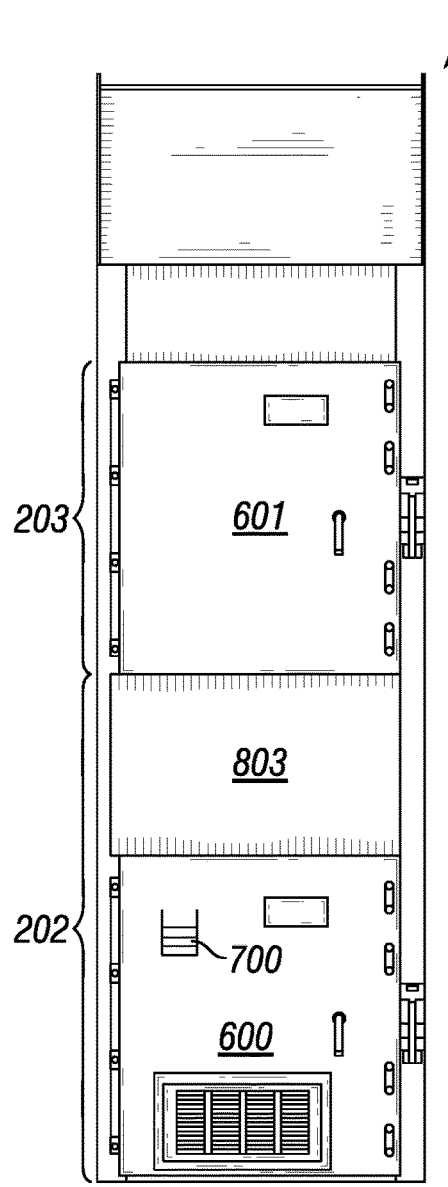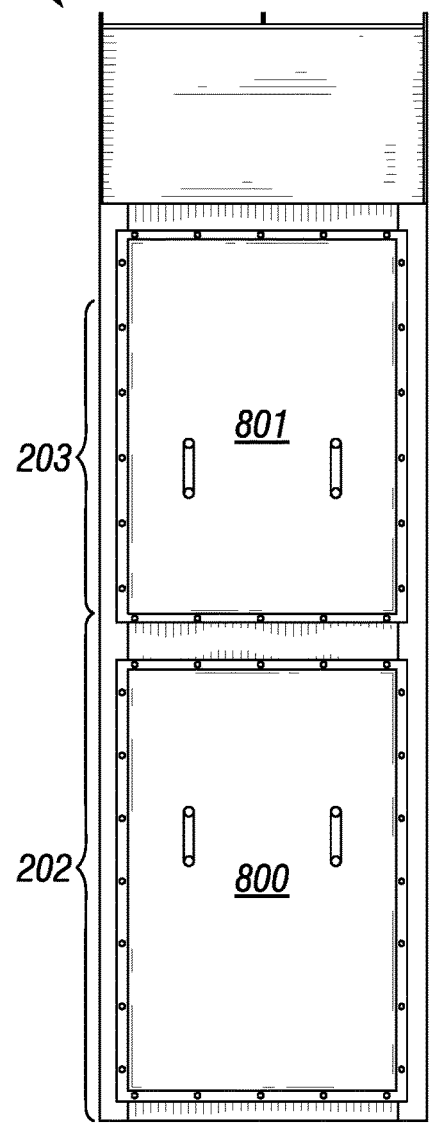
FIG. 7  FIG. 8

ARC RESISTANT DEVICE AND METHOD

TECHNICAL FIELD

Embodiments of the present disclosure relate to a medium voltage motor control center, more particularly, to an arc resistant voltage motor control center.

BACKGROUND

Medium voltage systems are often used to power heavy machinery, such as multiple high horsepower (e.g., 6000 hp) induction motors. FIG. 1 illustrates an example system having two such motors 101a,b. Each motor 101a,b may be driven by electrical current supplied from a power supply line 102, and through corresponding fused medium voltage bypass controllers 103a,b. The bypass controllers 103a,b may include a switch, a fuse that may be rated to carry large amounts of current, such as 400 Amps, a contactor and a current sensor.

The individual bypass controllers 103a,b may connect the motors 101a,b to the supply line 102 to allow the motors 101a,b to be run "across the line," or directly using the currents and phases of the supply line 102. However, during a startup procedure, it may be desirable to control one of the motors at less than normal frequency and thus operate the motor at some reduced speed because of load (e.g. pump) requirements.

Accordingly, during startup, the bypass controllers 103a,b are taken out of the control lines for the motors 101a,b. Instead, a variable frequency drive 104 may be connected, via a non-fused medium voltage transfer controller 105a, to the idle motor 101a. The variable frequency drive 104 may gradually vary the voltage and frequency supplied to the motor 101a through the non-fused transfer controller 105a, to gradually bring motor 101a up to speed.

Depending on load requirements, the individual motors 101a,b may be brought up to speed sequentially, so that a first motor 101a is brought up to speed before a second one 101b. In such a case, the transfer controllers 105a,b are also sequentially added to the control lines (e.g., controller 105a is used during startup of motor 101a, controller 105b is used during startup of motor 101b, etc.).

The commercially-available bypass controllers 103a,b that are rated for large levels of current (e.g., greater than 400 amps) are only offered for sale in single, standalone cabinets, as depicted in FIG. 1. The individual cabinets house just the components needed for the controller 103a,b, and do not offer additional space for additional controllers. As a result, significant amounts of floor space are required to support the various individual cabinets shown in FIG. 1. Even more space is occupied with the cabling, such as supply line 102, output bus 106, and lines 107a,b.

BRIEF DESCRIPTION OF THE DRAWINGS

For a more complete understanding of the present disclosure and its features and advantages, reference is now made to the following description, taken in conjunction with the accompanying drawings, in which:

FIG. 7 illustrates a front view of the medium voltage variable frequency drive control system, in accordance with an embodiment of the present disclosure;

FIG. 8 illustrates a back view of the medium voltage variable frequency drive control system, in accordance with an embodiment of the present disclosure.

DETAILED DESCRIPTION

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business-related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Figure 2A:
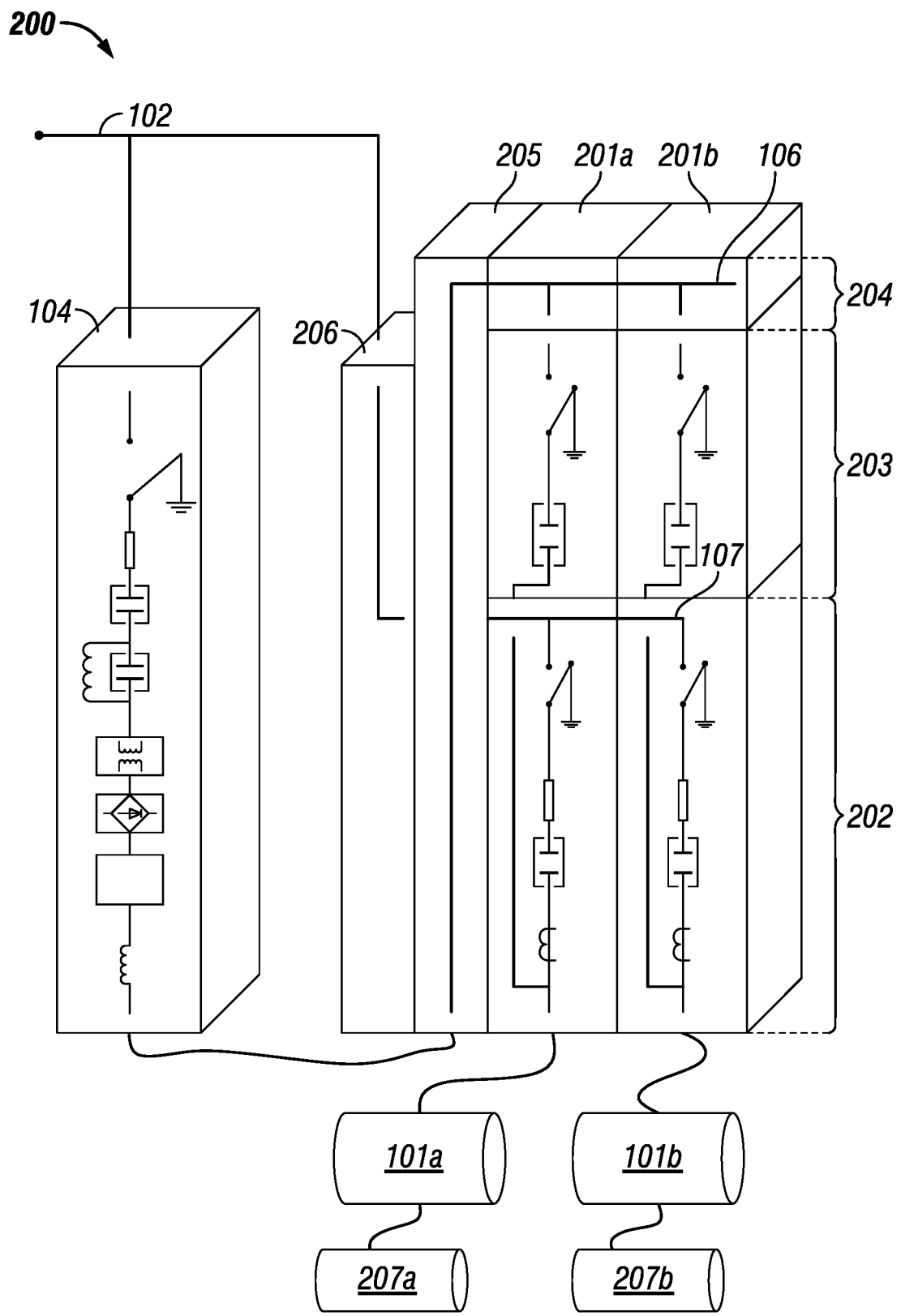
FIG. 2a illustrates a medium voltage variable frequency drive control system having a 2-high controller configuration with a dual bus system, in accordance with an embodiment of the present disclosure.

FIG. 2a illustrates an exemplary embodiment of a 2-high controller configuration for a medium voltage variable frequency drive control system 200. Medium voltage drive control systems 200 may be in the range of about 2300 to about 7200 Volts. The drive control system 200 may include a motor control cabinet 201a,b for each motor 101a,b being controlled. The motors 101a,b being controlled may operate up to about 6000 horsepower. The cabinet 201a,b may include portions stacked one above the other. A first portion 202 may include the bypass controller 103 components, and a second portion 203 may include the transfer controller 105 components. Stacking the components in this manner may help conserve floor space, and stacking the high-heat generating portion (the bypass controller 103 and its fuse) at the bottom helps reduce the risk of that portion receiving extraneous heat generated by other portions, such as the transfer portion 203.

The top-most portion of the cabinet may include an output bus portion 204. That portion 204 may include an extendable output bus 106 and wiring harnesses and trays to carry the output bus cabling from the transfer controller 105 to the variable frequency drive 104. In some embodiments, the output bus wiring from neighboring cabinets 201*a,b* may be routed across the tops of those cabinets in the output bus portions, and to a cabling transition cabinet, such as an end output bus cabinet 205. The end output bus cabinet 205 may be a vertical cabinet having an aperture (not shown) at the top to receive output bus wiring from the motor control cabinets 201*a,b*, and wiring harnesses and trays to carry the output bus wiring outside of the cabinet 205, where they may run over to the variable frequency drive 104's cabinet. FIG. 2*a* illustrates this output bus wiring as laying on the floor, but the output bus wiring may be routed in another wiring tray if desired between the output bus cabinet 205 and the variable frequency drive 104's cabinet.

The system 200 may also include a second cabling transition cabinet, in the form of a supply line cabinet 206, which may receive the supply line 102, and which may route that supply line to the neighboring motor control cabinets 201*a,b*. The supply line 102 may be routed into each of the bypass portions 202 of the motor control cabinets 201*a,b*, forming an extendable supply bus 107. If desired, the bypass portion 202 may further include a power supply line portion, which may have its own wiring harnesses and trays to carry the supply line 102 to the respective bypass controllers 103*a,b*. The system 200 may further include cabling connecting the variable frequency drive 104 to the supply line 102. The cabling connecting the variable frequency drive 104 to the supply line 102 may be external to the variable frequency drive 104 cabinet or internal to the cabinet.

Figure 2B:
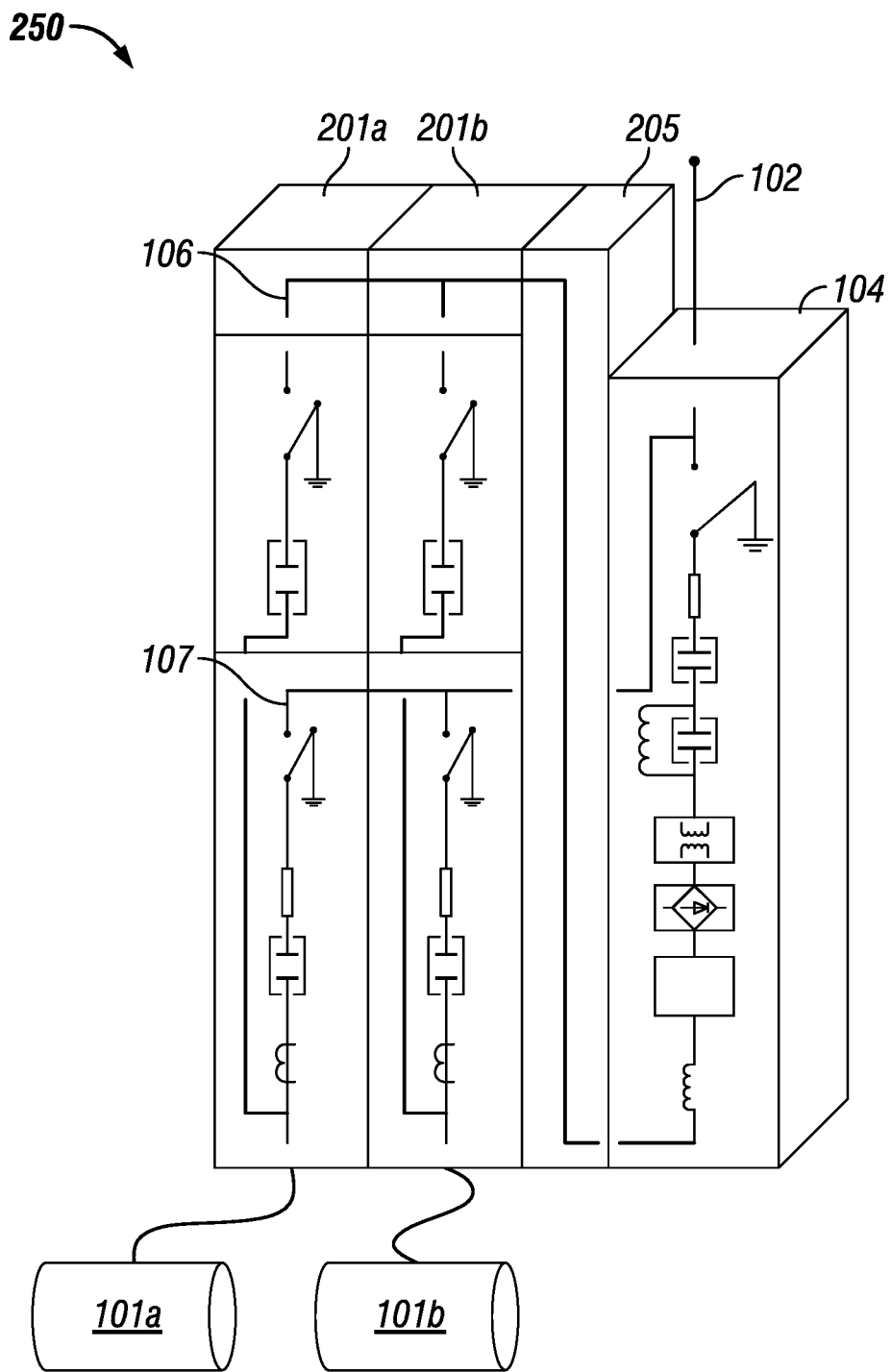
FIG. 2b illustrates an alternative configuration for the medium voltage variable frequency drive control system of FIG. 2a, in accordance with an embodiment of the present disclosure.

To further consolidate the components, a modified system 250 is shown in FIG. 2*b* having the variable frequency drive 104 cabinet attached to one end of the components shown in FIG. 2*a* (with output bus cabinet 205 moved to the right-hand side for ease of illustration, and omitting the supply line cabinet 206. Indeed, the motor control cabinets 201*a,b*, the cabling transition cabinets 205, 206, and the variable frequency drive cabinet 104 may be arranged in any suitable manner. For example, all of the cabinets may be arranged side by side and abut each other. Alternatively, the cabinets may be spaced apart. The drive control system 200 may further include at least one cabling transition cabinet configured to house cabling between controllers. With the output bus 106 and supply line bus 107 being extendable, additional motor control cabinets 201 may be added to the system in a modular and compact manner.

Figure 3:
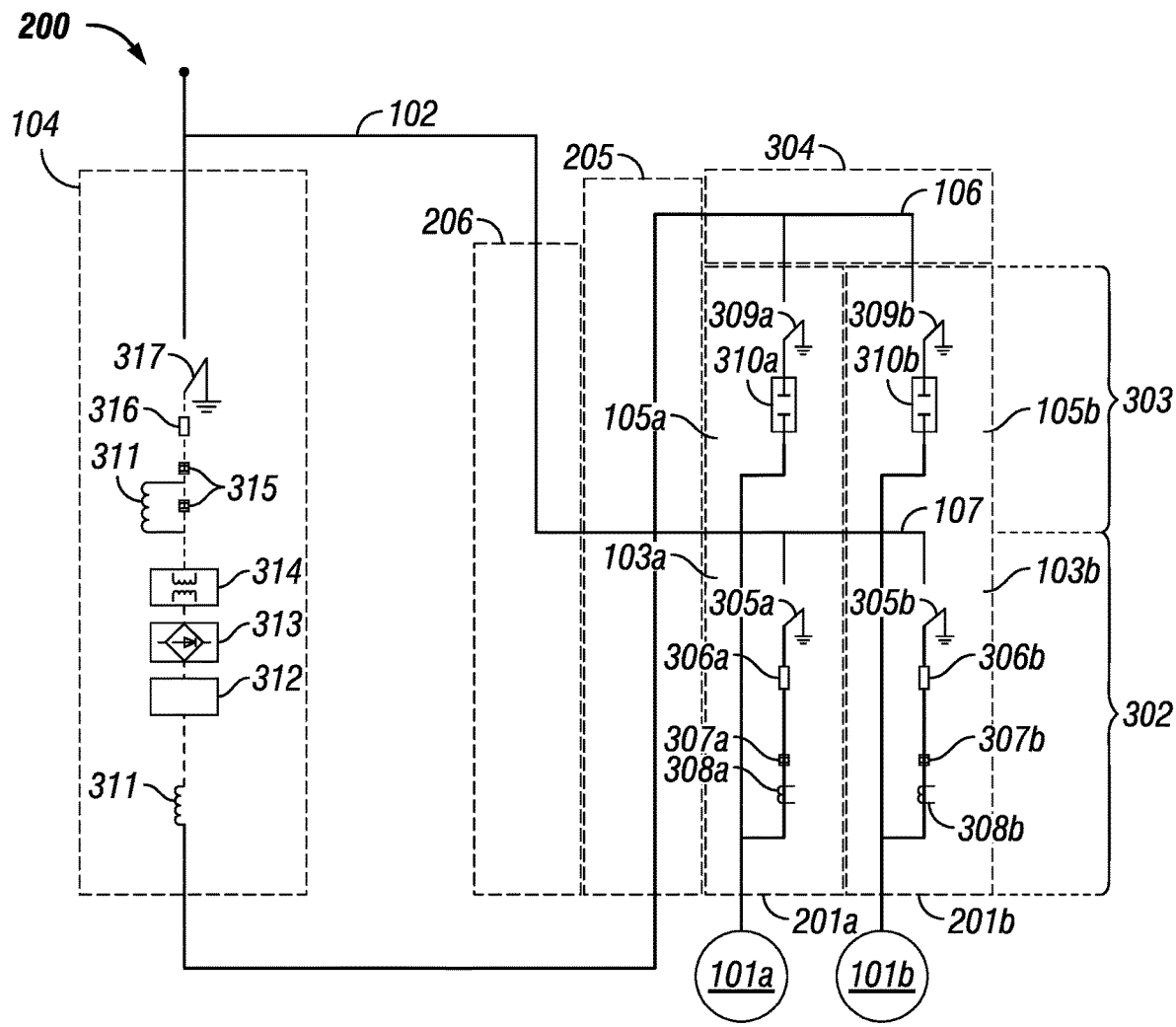
FIG. 3 illustrates the electrical components of the 2-high controller configuration of the medium voltage variable frequency drive control system of FIGS. 2a,b, in accordance with an embodiment of the present disclosure.

FIG. 3 illustrates the basic electrical components of the drive control system 200, with cabinet housings illustrated in dashed lines. As shown in FIG. 3, the motor control cabinets 201*a,b* may each include a top portion 303 that corresponds to the transfer portion 203 (e.g., FIG. 2*a*), and a bottom portion 302 that corresponds to the bypass portion 202 (e.g., FIG. 2*a*). A first fused bypass controller 103*a* may be housed within the bottom portion 302 and a first non-fused (e.g., omitting a fuse in the primary control line) transfer controller 105*a* within the top portion 303 of the first motor control cabinet 201*a*. The second motor control cabinet 201*b* may include a second fused bypass controller 103*b* housed within the bottom portion 302 and a second non fused transfer controller 105*b* within the top portion 303. The extendable supply bus 107 may extend through the bottom portion 302 of the motor control cabinets 201*a,b* and provide power to each of the bypass controllers 103*a,b*.

In one embodiment, illustrated in FIGS. 2*a,b*, the extendable output bus 106 may extend through the top portion 302 of the motor control cabinets 201*a,b* and electrically couple each of the transfer controllers 105*a,b* to the variable frequency drive 104. The extendable output bus 106 may be housed within top bus cabinet 304 that is positioned above or on top of the motor control cabinets 201*a,b*. In this embodiment, the extendable supply bus 106 extends downward through the top of the motor control cabinets 201*a,b* to couple the transfer controllers 105*a,b* to the variable frequency drive 104. Alternatively, the top bus cabinet 304 may simply be an internal portion of the motor control cabinet 201*a,b*.

The bypass controllers 103*a,b* may include any necessary components for directing power from the supply line 102 to the motors 101*a,b*, while bypassing the variable frequency drive 104, to run the motors across the line. For example, each of the bypass controllers 103*a,b* may include a switch 305*a,b*, a fuse 306*a,b*, a contactor 307*a,b*, and a protection sensor (e.g., current sensor) 308*a,b*. The transfer controllers 105*a,b* may include any necessary components for transferring power to the motors 101*a,b* between the power supply line 102 and the variable frequency drive 104. For example, each of the transfer controllers 105*a,b* may include a switch 309*a,b* and a contactor 310*a,b*, but may omit a fuse rated for high currents (greater than 400 Amps). The components of the bypass controllers 103*a,b* and transfer controllers 105*a,b* may all be rated to carry large amounts of current, greater than 400 Amps, and voltages between 2300 and 7200 volts, which are used in medium voltage systems 200.

Figure 1:
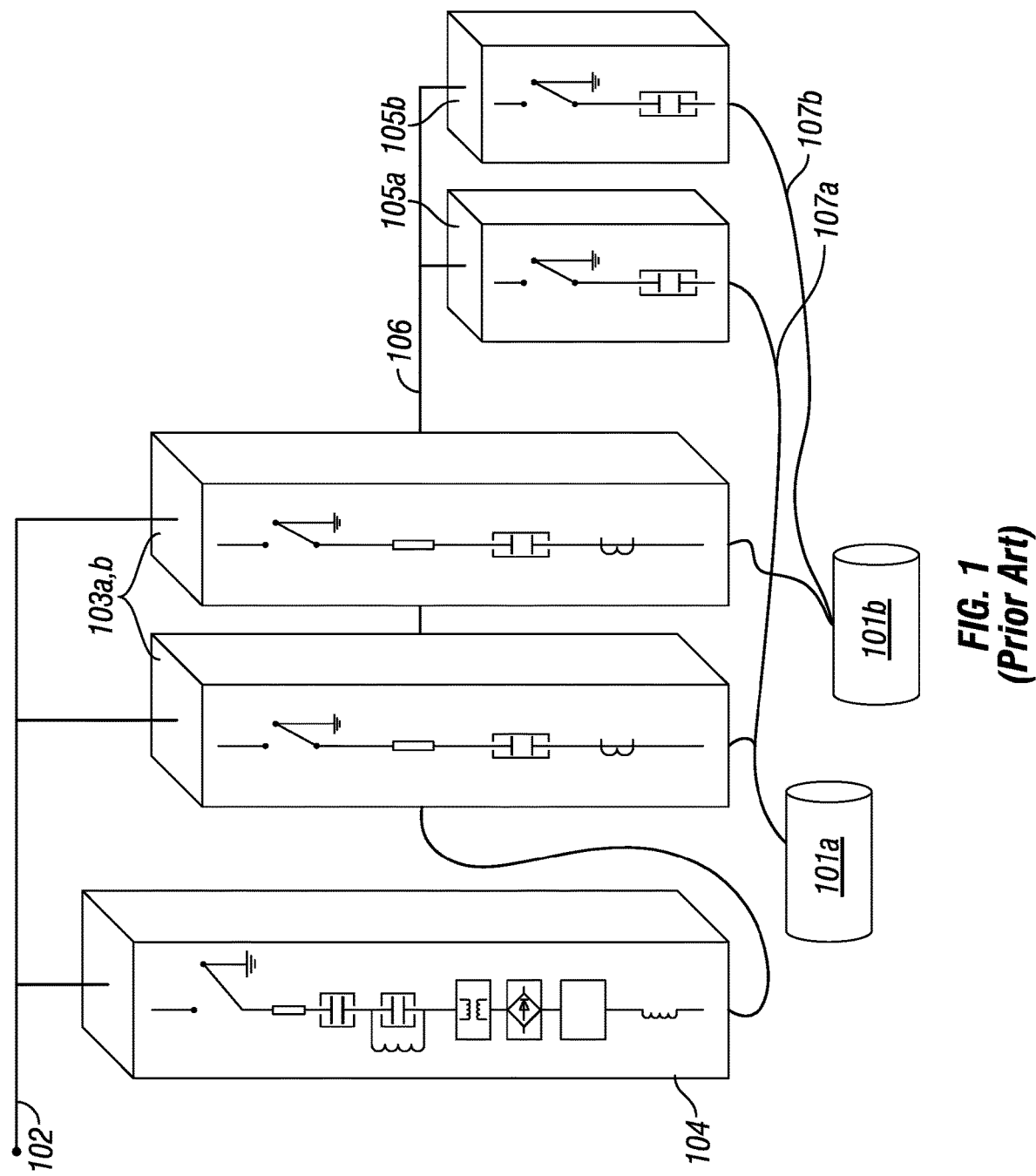
FIG. 1 illustrates a configuration of a medium voltage variable frequency drive control system having a single bus system, in accordance with an embodiment of the present disclosure.

Due to the heat-sensitivity of a fused-controller and the heat generated by the fuses in the bypass controllers 103*a,b*, only one fused controller can be located within a single cabinet in the prior art system shown in FIG. 1. However, by placing a less heat-sensitive controller, e.g., a non fused controller, within the same cabinet, the required cabinetry and floor space required for a drive control system 200 may be decreased. The non-fused transfer controllers may be positioned above the fused bypass controllers to reduce the number of required cabinets without subjecting the fused bypass controllers to additional heat.

The variable frequency drive 104 may include any necessary components to bring the motors 101*a,b* up to speed and stop the motors 101*a,b*. For example, as illustrated in FIG. 3, the variable frequency drive may include inductors 311, a transistor inverter 312, a rectifier 313, a transformer 314, contactors 315, fuses 316, and a switch 317. The variable frequency drive 104 may include additional components or alternative arrangements of components, other than the arrangement illustrated in FIG. 3, within the scope of the invention.

Figure 4:
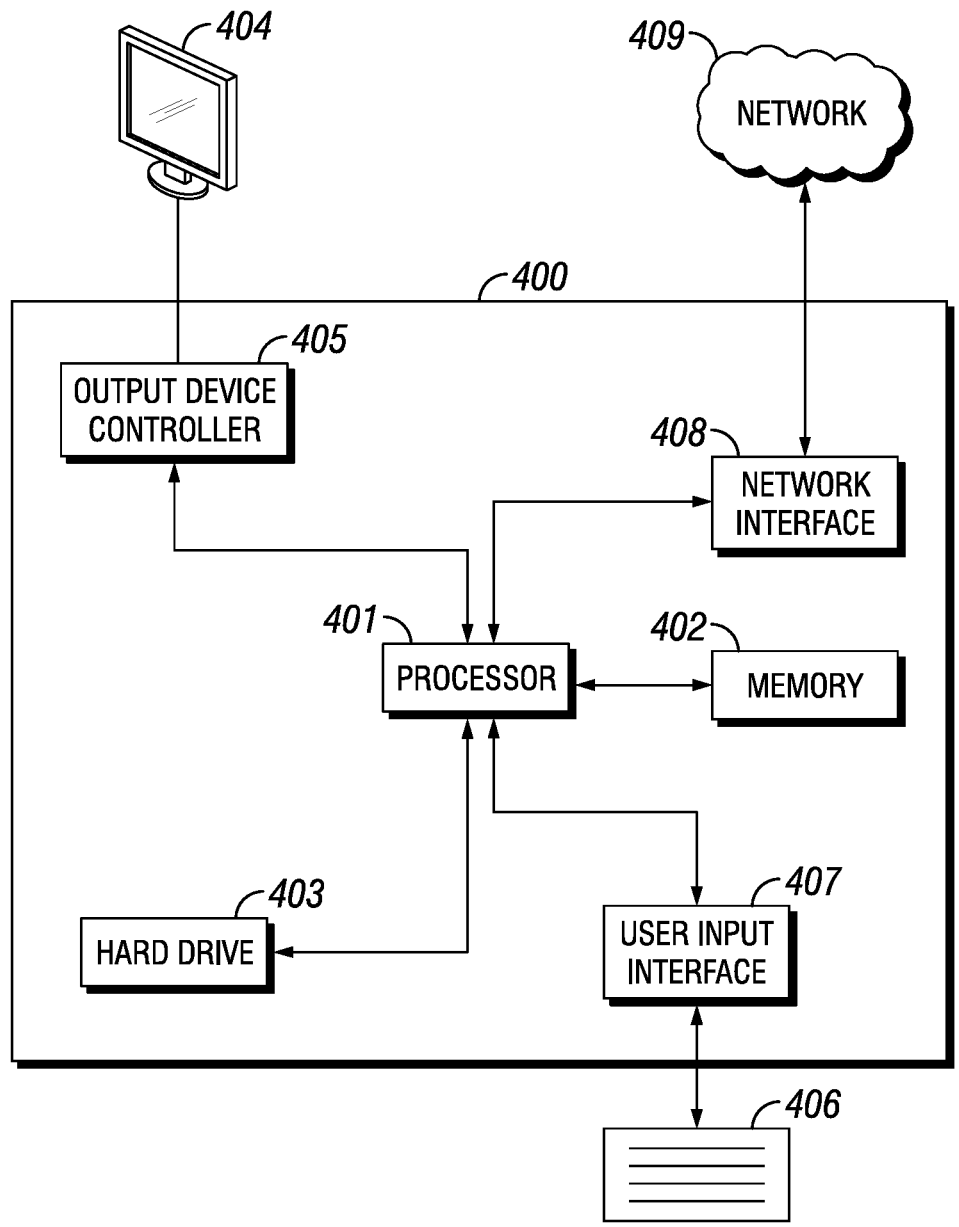
FIG. 4 illustrates a computer or server that may be used with the medium voltage drive control system, in accordance with an embodiment of the present disclosure.

The system 200 may further include software and/or hardware on a computing platform, such as a network server or computer, to control the operation of the various components of the system 200. For example, a controller computer may control the operation of the various contactors (307, 310) to couple and decouple the bypass and transfer controllers from the supply line and variable frequency drive 104. FIG. 4 illustrates the general hardware elements of such a server or computer 400. The server or computer 400 may include one or more processors 401, which may execute instructions of a computer program to perform any of the features described herein. Those instructions may be stored in any type of computer readable media or memory 402, to configure the operation of the processor 401. For example, instructions may be stored in a read only memory (ROM), random access memory (RAM), removable media, such as a Universal Serial Bus (USB) drive, compact disk (CD) or digital versatile disk (DVD), floppy disk drive, or any other desired electronic storage medium. Instructions may also be stored in a hard drive 403. The server or computer 400 may include one or more output devices, such as a monitor 404, speakers, or printers. The output devices may be controlled by one or more output device controllers 405, such as a video processor. There may also be one or more user input devices, such as a keyboard 406, mouse, touch screen, microphone, etc., which may be connected to the processor 401 through a user interface 407. The server or computer 400 may also include one or more network interface 408, such as a modem or network card to communicate with network 409. The network interface 408 may be a wired interface, wireless interface, or a combination of the two.

Figure 5:
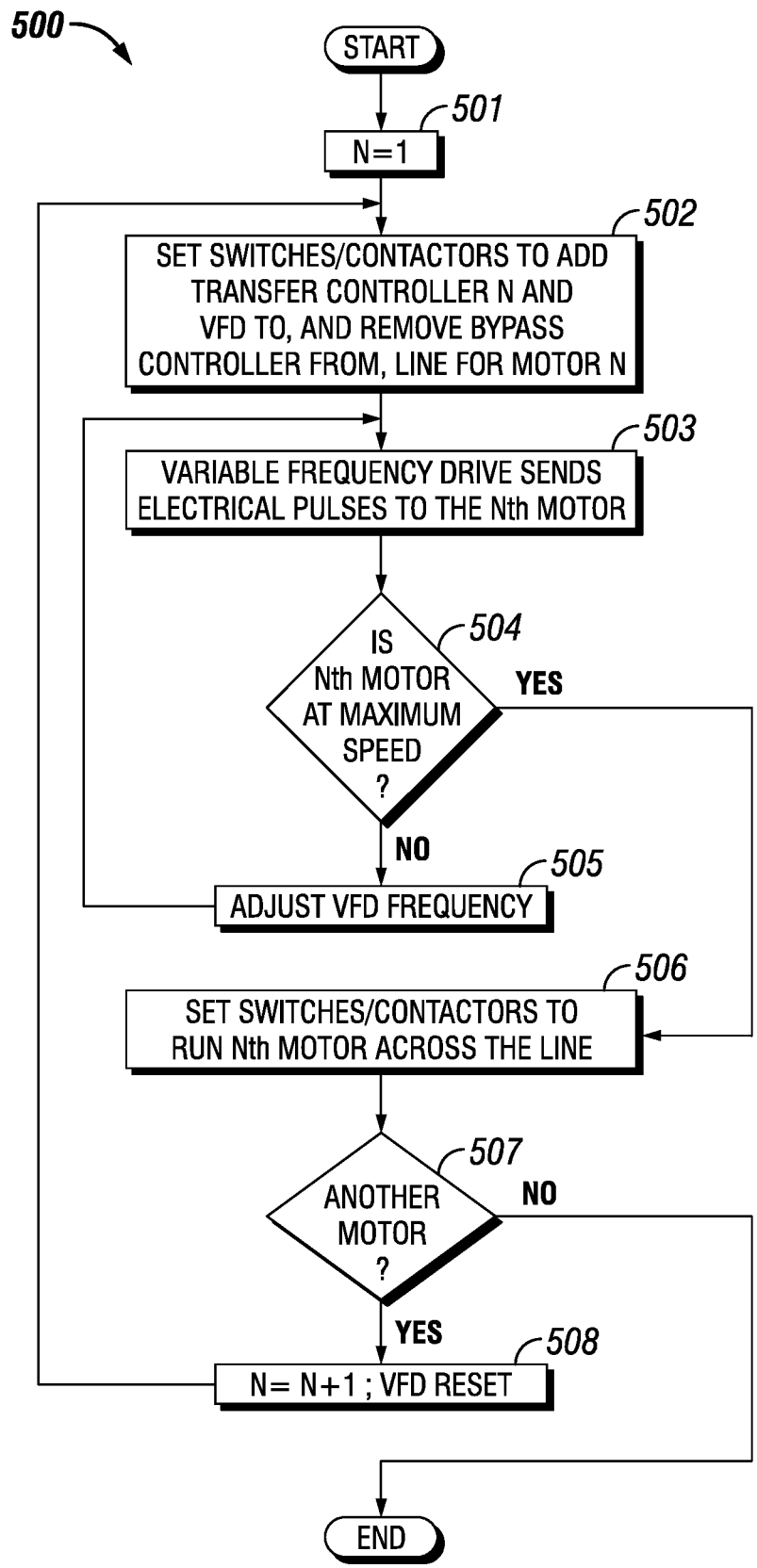
FIG. 5 illustrates a method of using a 2-high controller configuration of the medium voltage variable frequency drive control system of FIGS. 2-3, in accordance with an embodiment of the present disclosure.

In operation, system 200 may be used to power different types of machinery, such as pumping systems. To power a pumping system, each motor 101a,b may power a separate pump 207a,b, respectively, as shown in FIG. 2a. FIG. 5 illustrates a method 500 of using the drive control system 200 to start and operate the motors 101a,b for pumps 207a,b. Although the illustrated examples only show two motors 101a,b and pumps 207a,b, any desired number of motors and pumps may be used. As shown, system 200 includes one motor 101a,b for each motor control cabinet 201a,b. Alternatively, additional motors may be connected in parallel with one of the motors 101a,b, such that the motors are controlled by one motor control cabinet 201a,b and operate as a single motor.

In step 501, value n may be set to 1 (n will be used to step through the various motors in the system). In step 502, the non-fused transfer controller corresponding to the nth motor may be added to the control line circuit, while the corresponding bypass controller may be removed from the circuit. Using the FIG. 3 example, and for starting the first motor 101a, switch 309a may be closed (to add the transfer controller 105a to the circuit for motor 101a, while switch 305a may be opened to remove the bypass controller 103a from the circuit for motor 101a. In that switch configuration, variable frequency drive 104 is connected to the motor 101a through the transfer controller 105a.

Then, in step 503, variable frequency drive 104 may begin to apply electrical pulses to the motor being started. Those pulses may be set at an initial frequency. In step 504, the system may determine whether the motor has reached a predetermined operating speed. This determination may be made using any desired measuring technique (e.g., monitoring the rotational speed of a motor rotor), and using any desired value (e.g., stored in system memory) as the predetermined operating speed. If, in step 504, the motor has not reached the predetermined operating speed, then the system may proceed to step 505, in which the variable frequency drive 104 may increase or decrease the frequency of its pulses, and the process may return to step 503 to apply the modified frequency pulses to the motor. This loop may continue as long as desired or until the motor reaches maximum operating speed. In this manner, the speed of the motor may be regulated.

If the motor has reached its maximum operating speed, the system may then set the switches 506 (or contactors—in some embodiments, the switches are manually operated and used for safety purposes, to the "switching" herein may be performed using computer-controlled contactors) to run the motor across the line. In the FIG. 3 example, for the first motor 101a, this may involve opening contactor 310a in transfer controller 105a to remove the variable frequency drive 104 from the motor 101a's line, and to close contactor 307a to connect bypass controller 103a to motor 101a's line (thereby "bypassing" the variable frequency drive 104 in the motor's control line). In that configuration, motor 101a is connected to the bypass controller 103a, which in turn is directly connected to the supply line 102, and the current from the supply line 102 may be used to directly run motor 101a. This transfer of control may include synchronizing the frequencies of the variable frequency drive 104 with that on the supply line 102.

When the Nth motor is running across the line, the system may then proceed to step 507 to determine if another motor should be started. The determination to start another motor may be based on a level of need (if another motor is needed), or a user command entered into the system (e.g., via a computer as shown in FIG. 4). To start the next motor, the system may proceed to step 508, increasing N (to signify the next motor), and resetting the variable frequency drive 104 to the initial motor start frequency. The system may then return to step 502, and the variable frequency drive 104 may once again begin to apply current to start the next motor 101b. If, in step 507, no more motors are needed, then the process may simply conclude. Alternatively, the process may simply await in step 507 until another motor is needed.

The discussion above illustrates starting up motors, but a similar process may be used when it is necessary to stop or adjust the speed of a running motor. There, the transfer controller for the corresponding motor may be connected to the motor, with the variable frequency drive 104 synchronized to the current operating speed of the motor, and the motor's bypass controller may be removed from the circuit (by setting the switches as needed, such as in step 502). Then, the variable frequency drive 104 may apply gradually different (e.g., stepping down or up) frequency pulses to adjust the motor speed as needed. The transfer may occur by opening contactor 307b in the second bypass controller 103b and closing contactor 310b in the second transfer controller 105a. The variable frequency drive 104 may then adjust the speed of the second motor 101b, by adjusting the electrical pulses sent to the second motor 101b, until the second motor 101b stops (or reaches the desired new speed).

In the system 200, operation is facilitated by processor 401 or an equivalent automated device sending signals to actuators that are configured to open and close the contactors. While only two motors are shown in FIG. 3, any number of motors may be started and transferred to run off of the supply line 102.

Figure 6:
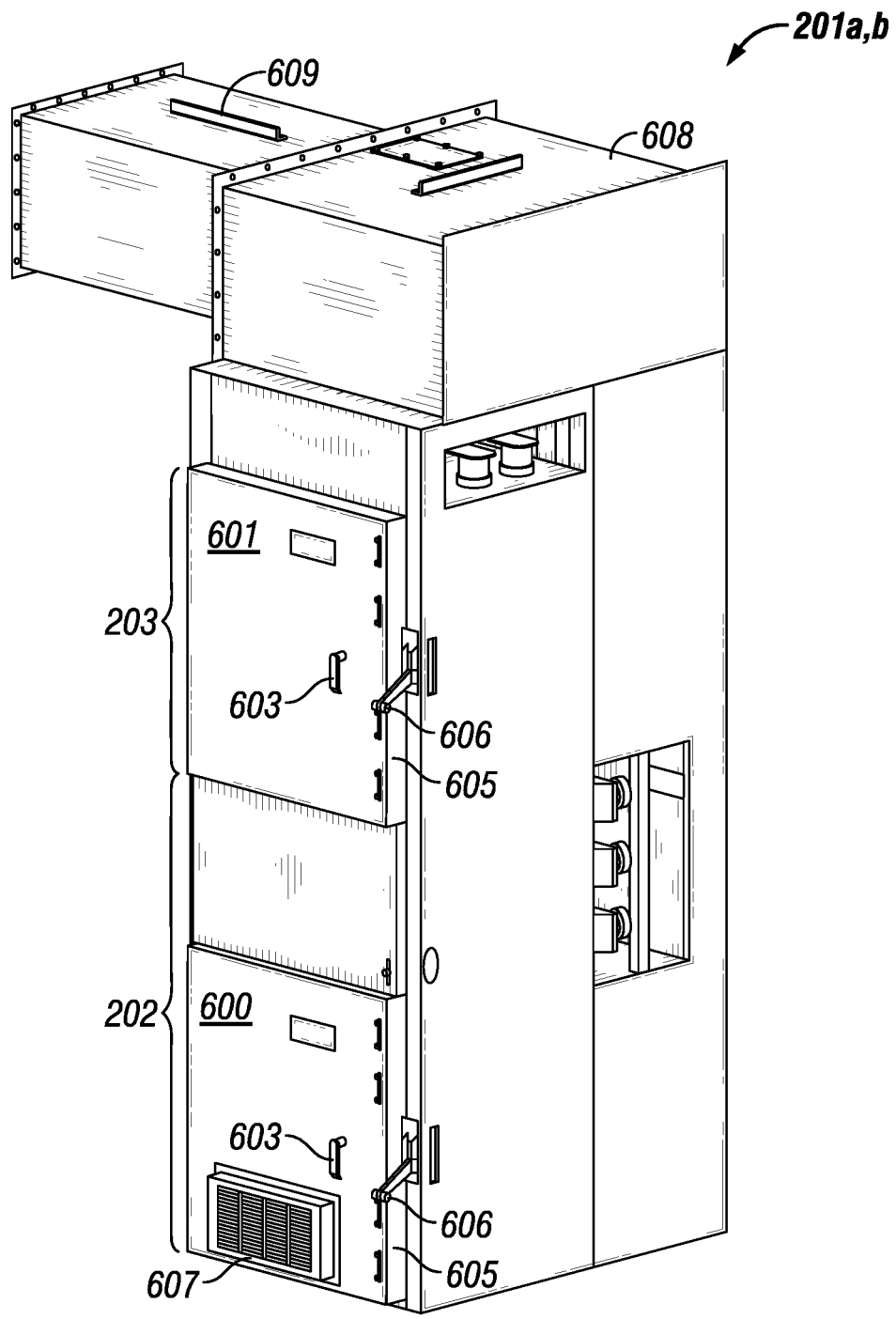
FIG. 6 illustrates an isometric view of the medium voltage variable frequency drive control system, in accordance with an embodiment of the present disclosure.

Referring now to FIG. 6, FIG. 6 illustrates an exemplary embodiment of one of the motor control cabinets 201a,b. As illustrated the bypass portion 202 may comprise a first door 600, and the transfer portion 203 may comprise a second door 601. The first door 600 may be configured to contain and/or provide access to the internal components disposed within the bypass portion 202. The second door 601 may be configured to contain and/or provide access to the internal component disposed within the transfer portion 203. Both the first door 600 and the second door 601 may be any suitable size, height, shape, and combinations thereof. In some embodiments, the first door 600 may have equivalent dimension to the second door 601. In other embodiments, the first door 600 may have different dimensions from the second door 601. Without limitations, the first door 600 and/or the second door 601 may have a suitable thickness, such as from about 0.05 to about 0.15 inches. In embodiments, the first door 600 and/or the second door 601 may have a thickness of about 0.12 inches. In embodiments, the first door 600 and/or the second door 601 may be arc resistant. Without limitations, the first door 600 and/or the second door 601 may comprise material that is arc resistant, such as 11 GA steel. During operations, an arc may be produced at a variety of points within the motor control cabinets 201a,b. Without limitations, the arc may occur at line disconnect locations. Undesired or unintended electric arcing may have detrimental effects on electric power transmission, distribution systems, and electronic equipment. Devices which may cause arcing include, without limitation, switches, circuit breakers, relay contacts, fuses, and poor cable terminations. When an inductive circuit is switched off, the current cannot instantaneously jump to zero; a transient arc will be formed across the separating contacts. If a circuit has enough current and voltage to sustain an arc formed outside of a switching device, the arc may cause damage to equipment such as melting of conductors, destruction of insulation, fire, and combinations thereof. An arc flash may be an explosive electrical event that presents a hazard to people and equipment. As such, the motor control cabinets 201a,b may be improved by being arc resistant to improve upon safety measures.

As illustrated, both the first door 600 and the second door 601 may comprise a handle 603. The handle 603 may be configured to be gripped and/or rotated to provide movement to the respective door. In embodiments, the first door 600 and/or the second door 601 may rotate along a vertical axis disposed about an opposite side of the door from the handle 603. The first door 600 and/or the second door 601 may further comprise an isolation handle 606 disposed about a side edge 605 of the first door 600 and the second door 601. Without limitations, each isolation handle 606 may be configured to be actuated so as to engage with an interior component within the motor control cabinet 201a,b. In embodiments, the isolation handle 606 corresponding to the first door 600 may be coupled to the switch 305a,b (referring to FIG. 3). During operation, actuation of this isolation handle 606 may connect or disconnect the switch 305a,b. In embodiments, the isolation handle 606 corresponding to the second door 601 may be coupled to the switch 309a,b (referring to FIG. 3). During operation, actuation of this isolation handle 606 may connect or disconnect the switch 309a,b The first door 600 may further comprise an air vent 607. The air vent 607 may allow fluid communication (for example, air) from the external environment into one of the motor control cabinets 201a,b. In embodiments, the air vent 607 may be arc resistant. Air may be provided to the internal components of one of the motor control cabinets 201a,b as necessary. For example, air vent 607 may allow air to flow into one of the motor control cabinets 201a,b for convection cooling of any internal components experiencing high temperatures. In the event of an arc occurring within one of the motor control cabinets 201a,b, the air vent 607 may be actuated to close, thereby protecting the surroundings from the effects of an arc.

At least one of the motor control cabinets 201a,b may further comprise a plenum 608 disposed atop the motor control cabinet 201a,b. In embodiments, exhaust produced from an arc may be collected within the plenum 608. As illustrated, the plenum 608 may be coupled to a plenum exhaust 609. In embodiments, the plenum exhaust 609 may vent the arc exhaust collected within the plenum 608 out of and away from the motor control cabinet 201a,b and the surroundings.

Figure 9:
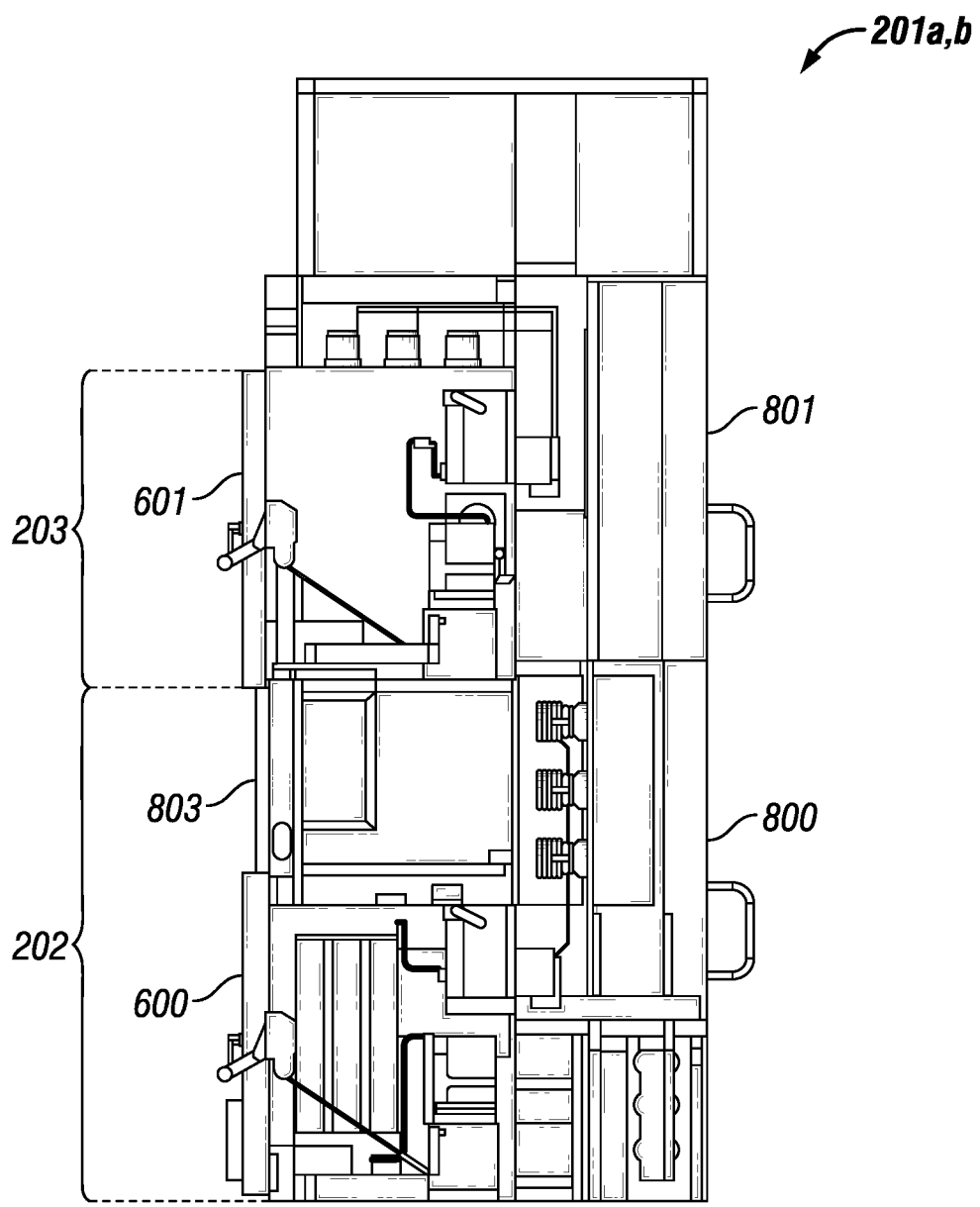
FIG. 9 illustrates a side, cross-sectional view of the medium voltage variable frequency drive control system, in accordance with an embodiment of the present disclosure.

FIGS. 7-9 illustrate other embodiments of one of the motor control cabinets 201a,b. FIG. 7 illustrates a front view of one of the motor control cabinets 201a,b. FIG. 8 illustrates a back view of one of the motor control cabinets 201a,b. FIG. 9 illustrates a side, cross-sectional view of one of the motor control cabinets 201a,b. As illustrated in FIG. 7, the first door 600 may comprise a motor connection 700. In embodiments, the motor connection 700 may be any suitable port or connector used to connect the motor control cabinet 201 a,b to the motors 101a,b (referring to FIG. 1). In embodiments, the entirety of the motor control cabinets 201a,b may be arc resistant. As illustrated, the motor control cabinet 201 a,b may comprise a first rear cover 800 and a second rear cover 801. The first rear cover 800 and/or the second rear cover 801 may provide protection from effects caused by an arc. Both the first rear cover 800 and the second rear cover 801 may be any suitable size, height, shape, and combinations thereof. In some embodiments, the first rear cover 800 may have equivalent dimension to the second rear cover 801. In other embodiments, the first rear cover 800 may have different dimensions from the second rear cover 801. Without limitations, the first rear cover 800 and/or the second rear cover 801 may have a suitable thickness, such as from about 0.05 to about 0.15 inches. In embodiments, the first rear cover 800 and/or the second rear cover 801 may have a thickness of about 0.12 inches. Without limitations, the first rear cover 800 and/or the second rear cover 801 may comprise material that is arc resistant, such as 11 GA steel. As illustrated, the second rear cover 801 may be disposed above the first rear cover 800 in relation to a vertical axis of the motor control cabinet 201 a,b. In embodiments, the first rear cover 800 may be disposed about the bypass portion 202 of the motor control cabinet 201 a,b, and the second rear cover 801 may be disposed about the transfer portion 203 of the motor control cabinet 201 a,b. Both the first rear cover 800 and the second rear cover 801 may be removable coupled to the motor control cabinet 201 a,b. Without limitations, the first rear cover 800 and the second rear cover 801 may be fastened to the motor control cabinet 201 a,b using any suitable fasteners such as bolts. Both the first rear cover 800 and the second rear cover 801 may provide access to the rear of the motor control cabinet 201 a,b.

The motor control cabinet 201 a,b may further comprise a low voltage compartment 803. As illustrated, the low voltage compartment is disposed within the bypass portion 202 and in between the first door 600 and the second door 601. In one or more embodiments, the low voltage compartment 803 may comprise monitoring equipment, control equipment, terminal blocks, connections to external controls, relays, and combinations thereof. In further embodiments, the low voltage compartment 803 is arc resistant.

Although the disclosure and its advantages have been described in detail, it should be understood that various changes, substitutions and alterations can be made herein without departing from the spirit and scope of the disclosure as defined by the following claims.

What is claimed is:

1. A drive control system comprising:
   a variable frequency drive cabinet comprising a variable frequency drive;
   a power supply line; and
   at least one motor control cabinet having a top portion and a bottom portion, wherein the at least one motor control cabinet comprises:
   a medium voltage fused bypass controller in the bottom portion;
   a medium voltage non-fused transfer controller in the top portion;
   a first door disposed within the bottom portion on a first side surface of the at least one motor control cabinet;
   a second door disposed within the top portion on the first side surface above the first door; and
   an air vent, wherein the air vent is disposed in the first door, wherein the first door, the second door, and the air vent are arc resistant;

wherein the variable frequency drive is coupled to the power supply line and the non-fused transfer controller and the fused bypass controller is coupled to the power supply line.

2. The drive control system of claim 1, further comprising:
a first rear cover;
a second rear cover; and
a low voltage compartment, wherein the low voltage compartment is disposed between the first door and the second door;
wherein the first rear cover, the second rear cover, and the low voltage compartment are arc resistant.

3. The drive control system of claim 1, further comprising a plenum, wherein the plenum is disposed on top of the at least one motor control cabinet and fluidly coupled to a plenum exhaust.

4. The drive control system of claim 1, further comprising:
at least one motor, wherein the at least one motor is coupled to the fused bypass controller and the non-fused transfer controller.

5. The drive control system of claim 1, further comprising:
an extendable supply bus in the bottom portion that couples the fused bypass controller to the power supply line; and
an extendable output bus in the top portion that couples the non-fused transfer controller to the variable frequency drive.

6. The drive control system of claim 5, further comprising:
at least one cabling transition cabinet housing a portion of cabling between the power supply line and the extended supply bus and housing a portion of the cabling between the extended output bus and the variable frequency drive.

7. The drive control system of claim 1, wherein the fused bypass controller comprises a switch, a fuse, a contactor, and a protection sensor, and the non-fused transfer controller comprises a switch, a contactor, and a protection sensor.

8. The drive control system of claim 7, further comprising a processor storing instructions on a computer readable medium, wherein executing the instructions causes the contactor in the non-fused transfer controller to open and the contactor in the fused bypass controller to close, transferring control of the motor from the variable frequency drive to the power supply line.

9. The drive control system of claim 1, wherein the fused bypass controller and the non-fused transfer controller are rated for voltages between 2300 and 7200 volts.

10. A motor control cabinet comprising:
a medium voltage fused bypass controller disposed in a bottom portion of the motor control cabinet;
a medium voltage non-fused transfer controller disposed in a top portion of the motor control cabinet;
a first door disposed within the bottom portion on a first side surface of the motor control cabinet;
a second door disposed within the top portion on the first side surface above the first door; and
an air vent, wherein the air vent is disposed in the first door, wherein the first door, the second door, and the air vent are arc resistant;
wherein the fused bypass controller and the non-fused transfer controller are rated for voltages between 2300 and 7200 volts.

11. The motor control cabinet of claim 10, further comprising:
a first rear cover;
a second rear cover; and
a low voltage compartment, wherein the low voltage compartment is disposed between the first door and the second door;
wherein the first rear cover, the second rear cover, and the low voltage compartment are arc resistant.

12. The motor control cabinet of claim 10, wherein the motor control cabinet is configured to house an extendable supply bus that is electrically coupled to the fused bypass controller, wherein the motor control cabinet is configured to house an extendable output bus that is electrically coupled to the non-fused transfer controller.

13. A drive control system comprising:
a first motor control cabinet comprising:
a first fused medium voltage bypass controller;
a first non-fused medium voltage transfer controller disposed above the first fused medium voltage bypass controller;
a first door disposed on a first side surface of the first motor control cabinet;
a second door disposed on the first side surface above the first door; and
an air vent, wherein the air vent is disposed in the first door, wherein the first door, the second door, and the air vent are arc resistant;
a second motor control cabinet comprising:
a second fused medium voltage bypass controller;
a second non-fused medium voltage transfer controller disposed above the second fused medium voltage bypass controller;
a first door disposed on a first side surface of the second motor control cabinet;
a second door disposed on the first side surface above the first door of the second motor control cabinet; and
an air vent, wherein the air vent is disposed in the first door, wherein the first door, the second door, and the air vent are arc resistant;
an extendable supply bus coupled to the first fused medium voltage bypass controller, the second fused medium voltage bypass controller, and a power supply line;
an extendable output bus coupled to the first non-fused medium voltage transfer controller and the second non-fused medium voltage transfer controller; and
a variable frequency drive cabinet comprising a variable frequency drive, wherein the variable frequency drive is coupled to the extendable output bus and the power supply line.

14. The drive control system of claim 13, further comprising:
a first motor and a second motor, wherein the first fused bypass controller and the first non-fused transfer controller are coupled to the first motor, and wherein the second fused bypass controller and the second non-fused transfer controller are coupled to the second motor.

15. The drive control system of claim 14, wherein the variable frequency drive is configured to regulate the speed of the first motor and second motor and to start and stop the first motor and the second motor.

16. The drive control system of claim 13, wherein each of the first motor control cabinet and the second motor control cabinet further comprises:

a first rear cover;

a second rear cover; and a low voltage compartment, wherein the low voltage compartment is disposed between the first door and the second door;

wherein the first rear cover, the second rear cover, and the low voltage compartment are arc resistant.

17. The drive control system of claim 13, further comprising:

at least one cabling transition cabinet housing a portion of cabling between the power supply line and the extended supply bus and housing a portion of cabling between the extended output bus and the variable frequency drive.

18. The drive control system of claim 13, wherein each of the first fused medium voltage bypass controller and the second fused medium voltage bypass controller includes a switch, a fuse, a contactor, and a protection sensor.

19. The drive control system of claim 13, wherein each of the first non-fused medium voltage transfer controller and the second non-fused medium voltage transfer controller includes a switch, a contactor, and a protection sensor.

20. The drive control system of claim 13, wherein the extendable output bus is housed within a top cabinet positioned above the first motor control cabinet and the second motor control cabinet, a portion of the extendable supply bus is housed within the first motor control cabinet, and a portion of the extendable supply bus is housed within the second motor control cabinet.

* * * * *